United States Patent [19]

Yang et al.

[11] Patent Number: 5,267,390
[45] Date of Patent: Dec. 7, 1993

[54] ORGANIC VAPOR DEPOSITION PROCESS FOR CORROSION PROTECTION OF PRESTAMPED METAL SUBSTRATES

[76] Inventors: Duck J. Yang, 112 Bellant Cir., Wilmington, Del. 19807; Joseph A. Antonelli, 860 Homewood Dr., Riverton, N.J. 08077; Melville J. Camelon, 5051 Skylite La., Shelby Township, Macomb County, Mich. 48316; Tyau-Jeen Lin, 3131 Meetinghouse Rd., Boothwyn, Pa. 19061; Hirotsugu Yasuda, 1004 Lake Point La., Columbia, Mo. 65203

[21] Appl. No.: 685,748

[22] Filed: Apr. 15, 1991

[51] Int. Cl.⁵ .................. C23C 16/02; C23C 16/46
[52] U.S. Cl. .................. 29/527.4; 427/255.6; 427/255.7; 427/409; 427/327; 29/DIG. 37; 205/188; 205/205
[58] Field of Search ............... 427/255.6, 255.7, 40, 427/533, 409, 327; 204/192.12; 74/46; 29/DIG. 37, 527.4; 205/188, 205

[56] References Cited

U.S. PATENT DOCUMENTS

| | | | |
|---|---|---|---|
| 4,292,827 | 10/1981 | Waugh | 72/46 |
| 4,761,212 | 8/1988 | Watanabe et al. | 204/181.1 |
| 4,784,881 | 11/1988 | Fiore et al. | 427/255.6 |
| 4,983,454 | 1/1991 | Hiraki et al. | 428/335 |

*Primary Examiner*—Terry J. Owens
*Assistant Examiner*—Bret Chen
*Attorney, Agent, or Firm*—Chris P. Konkol

[57] ABSTRACT

A process for improved corrosion protection of a metal substrates involving organic vapor deposition of a thin film by polymerization of certain precursors onto one side of the phosphated flat metal substrate (15). Following stamping and assembly of the metal substrate, a primer and topcoat may be applied over the other side of the metal substrate. The process is particularly applicable to coil steel employed in the original manufacture of automobiles, trucks, and parts thereof.

18 Claims, 1 Drawing Sheet

ORGANIC VAPOR DEPOSITION PROCESS FOR CORROSION PROTECTION OF PRESTAMPED METAL SUBSTRATES

FIELD OF THE INVENTION

This invention relates to corrosion protection of metal substrates by organic vapor deposition of a thin polymeric film to one side of the metal substrate prior to stamping. The invention is especially applicable to the corrosion protection of pre-stamped galvanized steel substrates used in automotive production.

BACKGROUND

The corrosion protection of steel substrates is important for many industries, including the automotive and steel industries. Currently, the most common methods of corrosion protection of steel substrates include galvanizing, application of zinc phosphate, electrodeposition of organics, conventional spray or dip priming, oil coating, and combinations thereof. However, for high performance uses in the automotive industry, such methods are associated with the following problems: (1) pollution in the form of volatile organic compounds (VOC), (2) excessive waste disposal, (3) inadequate coverage of recessed areas, and (4) inadequate long term corrosion protection.

It is generally known that a process of organic vapor deposition (OVD), onto a substrate, may be used to provide a thin layer of film, with uniform deposition, no "pin holes," and good edge coverage. Furthermore, such a process does not require the use of solvents, so there is no VOC problem. However, most of the previous work in the area of vapor deposition has been restricted to small objects. In particular, organic vapor deposition has been used for coating micro-electronic or electrical components in electronic and medical devices.

A widely used coating or polymeric material formed by organic vapor deposition is poly-p-xylylene polymer (PARYLENE, commercially available from Union Carbide, Hartford, Conn.). For example, U.S. Pat. No. 3,342,754 discloses vapor deposition of poly-p-xylylene polymers through the cracking of para-xylylene dimers (di-para-xylylene and derivatives) under low pressure. Another patent, JO 1168859A, discloses organic vapor deposition of such a polymer for improving the wear resistance of sliding plastic parts and for imparting corrosion resistance to metal surfaces. However, the latter patent differs from the present process with respect to treatment of the metal surface before and after organic vapor deposition (OVD).

U.S. Pat. No. 4,784,881 discloses organic vapor deposition, using organophosphates as an adhesion promoter to improve adhesion between the deposited film and the substrate. However, this patent does not disclose the use of a metal phosphate, with or without a passivating treatment. Since the patent teaches organic vapor deposition for the purpose of adhesion improvement of substrates used in the electronic industry, it is not believed that such treatment would provide adequate corrosion protection to meet automotive standard requirements. To applicants' knowledge, vapor deposition for corrosion protection of automobiles and structural parts thereof has never been commercially realized.

U.S. Pat. No. 4,950,365 discloses coating poly-p-xylylene over a hard wear-resistant coating such as used in steel tools or instruments. The first step of the two step process disclosed in this patent requires the coating of a metal substrate with a thin, hard layer of a metal compound such as titanium nitride. The second step consists of applying a uniform conformal material exemplified by poly-p-xylylene.

U.S. Pat. Nos. 4,495,889 and 4,518,623 disclose a method and apparatus for organic vapor deposition coating, in which system pressure (related to the film properties) and evaporation temperature (related to the polymerization rate) can be continuously monitored and automatically regulated so that coatings with desired physical properties and deposition rate may be obtained.

Plasma surface modification of a coating formed by organic vapor deposition has also been disclosed. For example, U.S. Pat. No. 4,123,308 discloses a process wherein a low temperature plasma is employed to chemically modify the surface of a poly-p-xylylene film to incorporate oxygen atoms into the backbone of the polymer. Thereafter, a thermosetting resin such as methyl silicone, methyl phenyl silicone, epoxy, polyurethane, or the like may be chemically bonded to the poly-p-xylylene coated substrate via reaction between oxygen-containing groups at the surface of the poly-p-xylylene and a reactant component of the thermosetting resin.

Notwithstanding the teachings in the prior art, there is a need for a method for providing improved corrosion protection of metal substrates such as employed in automotive production, particularly metal substrates which will thereafter receive one or more coatings to obtain an aesthetically appealing finish. The application of a protective layer or film by organic vapor deposition, for the corrosion protection of metal substrates, must result in good adhesion, good edge coverage, and good barrier properties.

SUMMARY OF THE INVENTION

It has been discovered that improved corrosion resistance of a metal substrate may be realized by the following procedure:

(a) treating a substantially flat metal substrate, such as a steel sheet or strip, prior to stamping, with a metal phosphate containing agent;

(b) subsequently applying, by means of organic vapor deposition, a thin film of a polymer onto the phosphated surface of a first of the two flat sides of said metal substrate; and (c) subsequently stamping the metal substrate to shape it for its intended use; and (d) subsequently coating the metal substrate on its second side, opposite to the side having said thin film, with a primer.

In a preferred embodiment, the method of the present invention involves coating a substantially flat galvanized steel substrate, such as a strip or elongated sheet from a steel coil, preliminary to stamping, as follows:

(a) treating the surface of the metal substrate with a metal phosphate containing agent selected from the group consisting of zinc phosphate or iron phosphate, with or without a passivating treatment;

(b) applying, by means of organic vapor deposition, a thin film of a polymer onto the surface of a first of the two flat sides of said metal substrate so treated, wherein said polymer is selected from the group consisting of poly-p-xylylene, poly(chloro-p-xylylene), or a derivative thereof, wherein said organic vapor deposition is carried out under vacuum and the polymer is formed from a corresponding reactive monomer species produced through pyrolysis of its corresponding dimer; and (c) stamping the metal substrate to shape it for its intended use; and (d) coating the metal substrate on the second side, opposite to the side having said thin film, with a primer.

Figure 1:
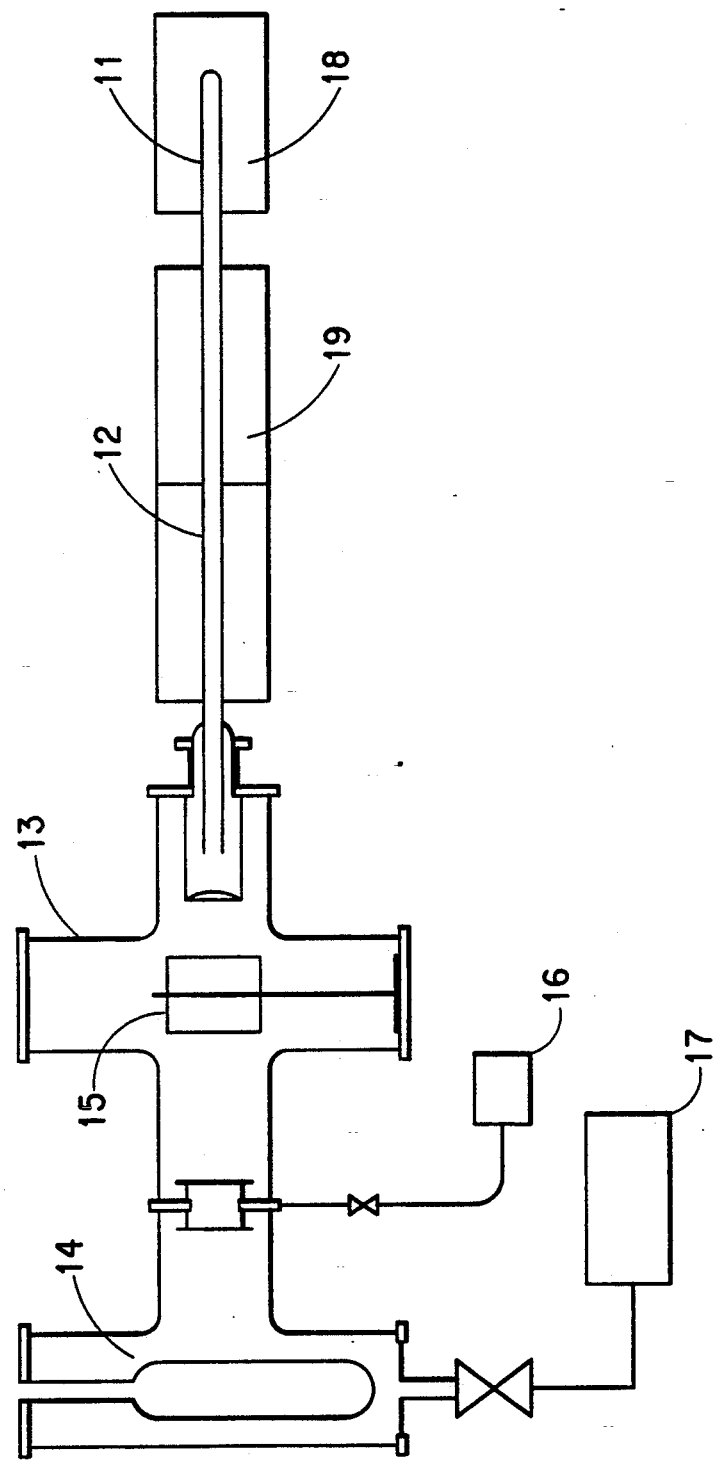
FIG. 1 a schematic drawing of a vapor deposition system according to the present invention, showing, from right to left, a sublimation tube, a pyrolysis tube, a vacuum chamber, related piping and so forth.

The drawing may be better understood upon reference to the following detailed description of the invention.

DETAILED DESCRIPTION OF THE INVENTION

As indicated above, the present invention is directed to a coating system involving vapor deposition of a polymeric film to protect a metal surface from corrosion. Such a system is applicable to a variety of different types of metal, for example rolls, coils, sheets and the like. Suitable metal substrates include cold-rolled steel, stainless steel, aluminum, tin, copper, or alloys thereof. However, it was found that the least corrosion occurred when the present invention was used to treat galvanized steel as compared to steel having no zinc protective layer.

Applicants' novel system involves coating one side of a metal substrate, prior to stamping, with a thin film layer or layers of an organic polymer, by organic vapor deposition (OVD) in an evacuated chamber. After the deposition of such a film, and following stamping of the metal substrate, for example to produce an automotive part, the other side of the metal substrate, opposite to the side having the OVD thin film, may be phosphated and subsequently coated, typically with a primer, primer surfacer, and topcoat, in sequence. The side of the metal substrate with the OVD film may or may not receive the same coatings as the other side.

The substrate to be treated according to the present invention is treated with a metal phosphate containing agent to prepare the surface prior to organic vapor deposition (OVD). The metal phosphate containing agent is applied in an effective amount to prevent corrosion and to promote adhesion of the OVD film to the metal surface. It is believed that such adhesion is due to the metal phosphate producing a microcrystalline surface. Preferred metal phosphates include iron phosphate and most preferably zinc phosphate.

Metal phosphating of steel, for corrosion protection, is generally well known in the automotive paint industry. For example, zinc phosphate coatings can be made to crystallize from solution onto the metal surface being treated. Typically, a soluble dihydrogen phosphate $Zn(H_2PO_4)_2$ is made to disproportionate to form insoluble tertiary zinc phosphate $Zn_3(PO_4)_2$ and phosphoric acid. Following treatment of a metal substrate with a metal phosphate, the treated metal substrate may optionally be subjected to passivation. A common passivating agent is chromic acid.

As indicated above, the use of galvanized steel, as a substrate, produces superior results. Galvanizing of the substrate may be accomplished by vapor deposition of zinc or zinc alloys. Suitable methods of vapor deposition include evaporation deposition, glow discharge sputtering deposition, and ion plating. Zinc or Zinc alloy films of high quality, having excellent adhesion, can be obtained. Corrosion or mechanical properties of the zinc layer, such as grain structure, grain size, crystallinity, morphology, and impurity content, may be manipulated in a controllable manner. Such control may be exercised by adjusting the operating parameters such as plasma conditions, gas flow, substrate temperature, etc.

The metal substrate to be treated according to the present invention preferably is galvanized steel coated with a film of zinc or zinc alloy in an amount of 5-120 grams/m$^2$, preferably 10-70 grams/m$^2$. A significant advantage of the present invention is that protection of the substrate by the organic vapor deposited coating may be used to reduce the zinc layer, used in galvanizing steel, from its current level, for example 60 g/m$^2$, to a significantly lower level, for example 20 g/m$^2$, while obtaining the same degree of corrosion protection. Thus, the greater the thickness of the OVD film, the less zinc may be required and vice versa. Important benefits which may be derived from the use of low zinc steel include lower material cost and easier recycling.

Following treatment with a metal phosphate, the metal substrate then receives, by means of organic vapor deposition, a thin film layer of a polymeric material. Preferred polymers are poly-p-xylylenes such as poly(chloro-p-xylylene), also referred to as PARAL-YENE C (Union Carbide Corp.). A dense polymer film of a poly-p-xylylene polymer may be formed under vacuum from a corresponding reactive monomer species produced through pyrolysis of its corresponding dimer having been sublimed in vacuum. The poly-p-xylylene film may be deposited conformally, in a microscopic view, on the substrate surface when the reactive monomer species is exposed to the surface at a sufficiently low temperature (lower than the ceiling temperature of the polymer). By such method, the poly-p-xylylene polymer thin film can penetrate to a small area in a microscopic enclosure such as pores in the phosphate crystal structure on a steel surface.

The commercially available monochloro-substituted dimer, employed to produce a poly(chloro-p-xylylene) film, has the following chemical structure:

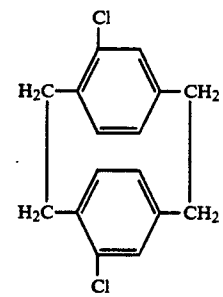

Various other kinds of substitutions are possible, as will be known to those skilled in the art. For example, it is possible to employ the dichloro-para-xylylene dimer. A poly-p-xylylene polymer, employed in the present method, may be represented by the following general chemical structure:

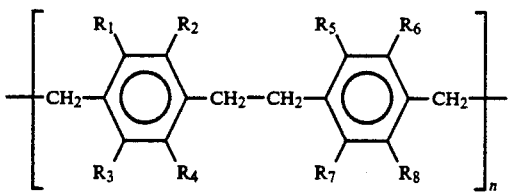

Substituents $R_1$ to $R_8$ may be, for example allyl, aryl, alkenyl, cyano, carboxyl, alkoxy, hydroxy, hydrogen, halogen, and/or amino, and combinations thereof. Preferred groups are lower alkyls of one to 10 carbon atoms, most preferably 1 to 6 carbon atoms, halogens (chlorine, bromine, iodine, and fluorine), and hydrogen. Suitable aryl hydrocarbons, having 1-2 benzene rings, include phenyl, naphthyl and derivatives thereof.

Such dimer molecules, when sublimated and subjected to cracking at elevated temperatures under vacuum, are believed to dissociate into the following quinoid form, in the case of the unsubstituted dimer:

The process of polymerization to obtain poly-p-xylylene is well known and discussed in Yasuda, H., PLASMA POLYMERIZATION, Academic Press (1985) at pages 65–71. See also KIRK-OTHMER ENCYCLOPEDIA OF TECHNOLOGY, Vol. 24, "Xylene Polymers" at page 744. Methods of preparing dimers such as di-p-xylylene or (2,2)-paracyclophane and derivatives, for use in the present invention, have been published. Recent patents, directed to improving yields or other features in synthesizing such dimers, include U.S. Pat. No. 3,342,754; U.S. Pat. No. 4,532,369; U.S. Pat. No. 4,675,462; U.S. Pat. No. 4,734,533; and U.S. Pat. No. 4,783,561, hereby incorporated by reference.

The vapor deposition of such polymers as poly(-chloro-para-xylylene) may be carried out in a deposition system depicted in FIG. 1. FIG. 1 shows a sublimation tube (11), pyrolysis tube (12), deposition chamber (13), cold trap (14), substrate (15), pressure gauge (16), vacuum pump (17), sublimation heater (18), and pyrolysis furnace (19).

In operation, the substrate (15) is positioned in the center part of the deposition chamber (13). Meanwhile, a starting material, such as the dimer di(chloro-para-xylylene), is weighed and charged into the sublimation tube (11). Before introducing the starting material, the whole system is evacuated using the rotary pump (17) to a preselected vacuum pressure in the range of about 0.001 to 10 torr, typically lower than 6 millitorrs, which vacuum is measured by the pressure gauge (16). When the temperature in the pyrolysis tube (12) reaches the desired temperature, suitably 650 ° C. using furnace (19), the cold trap (14) is filled with liquid nitrogen and the sublimation heater (18) is turned on. The temperature in the sublimation tube (11) is maintained at an elevated temperature, suitably 140° C., and the temperature in the pyrolysis tube (12) is maintained throughout the deposition process.

The substrate temperature is suitably maintained at a temperature from −196° C. to 80° C., preferably −80° to 50° C., and the deposition time is suitably from 1 minute to 4 hours. The film thickness suitably ranges from about 1 to 100 μm, preferably 0.1 to 1.0 mil (2.5 to 25 μm).

After completion of the deposition, the liquid nitrogen is removed from the cold trap (14). When the cold trap (14) reaches room temperature, air is released to break the vacuum of the system. The coated substrate may then be removed from the deposition chamber (13).

The organic vapor deposition onto a metal substrate, on commercial scale, may be carried out in a continuous process, wherein a continuous strip of metal is passed through a sealed apparatus for organic vapor deposition. An illustrative continuous coating apparatus is disclosed in U.S. Pat. No. 4,763,601, which apparatus is capable of producing, on a commercial scale, a coiled strip with improved corrosion resistance and other properties.

As indicated above, after the metal substrate is subjected to organic vapor deposition (OVD) on the surface of one side thereof, the metal substrate may be stamped and assembled for its intended use, for example in the production of automobiles, trucks, or parts thereof.

Subsequently, a primer is applied, at least to the other side of the metal substrate, opposite to the side having the OVD film. Application of the primer may be accomplished in any of a number of different manners well known in the art (e.g., cathodic or anodic electrocoating, supercritical fluid coating, dipping, spraying, rolling, powder coatings, vacuum deposition polymerization, and so forth). Typicaly, the primer will be applied to the metal substrate by immersing the substrate in an electrocoat bath. In such case, the primer will adhere to the surface of the substrate not having the OVD film.

Any of a number of different primer coatings well known in the art may be use. Examples include, but are not restricted to acrylic silane, polyester silane, polyester urethane-silane, melamine/polyester, melamine/-polyester urethane, epoxy/anhydride, epoxy/amine, polyester isocyanate, polyether vinyl, and the like. It is important that a primer have good adhesion, barrier and anti-corrosion properties.

The primer may or may not contain catalysts (or accelerators), such as dialkyl tin oxide compounds, $H_2O$, acids, organotitanates, or organozirconates.

The primer thickness may vary widely. Primer films of 2.5 microns to 125 microns thick may be coated on steels, but a preferred thickness range is 10.0 microns to 50 microns.

After deposition of a primer, a subsequent coating or topcoat may also be applied. The term "topcoat" is herein used generically to include basecoats, primer surfacers, monocoats, basecoat/clearcoat systems, or any other topcoat system known in the art.

A metal substrate with an OVD film, that is a thin film deposited by mean of organic vapor deposition, has superior corrosion protection compared to the same metal without the thin film. It may provide the desired degree of corrosion protection without further coatings. However, additional coatings over the OVD film are optional, since corrosion protection is even more dramatically improved by application of a subsequent primer coating. Likewise, a metal substrate with both an OVD film and a primer coating has superior corrosion protection to a metal substrate with only the primer coating. Alternatively, a topcoat may be applied directly onto the OVD film without a primer. The application of further coatings over an OVD film is disclosed in commonly assigned cocurrently filed copending application Ser. No. 07/685,747, hereby incorporated by reference.

The process according to the present invention is particularly applicable to corrosion protection of coil steel that will be employed in automotive manufacture. In a preferred embodiment of the present process, an OVD film is used to protect one side, either the upper or lower side, of a generally flat sheet or strip of steel, for example from a coil steel supply. Conventional coating methods may be used to provide corrosion protection for the opposite side of the coil steel. In this embodiment, after the organic vapor deposition is applied to one side of the coil steel, the coil steel may be stamped and assembled into a body part used in the manufacture of automobiles or trucks. Subsequently, said opposite side of the steel automotive part, not having the OVD thin film, may be phosphated and receive an electrocoat primer, preferably a silane functional block polymer. Following the electrocoat primer, all or part of the surface of the automotive part may additionally receive a primer surfacer and a topcoat, typically applied in sequence. The topcoat, as indicated above, may comprise a monocoat or a basecoat/clearcoat system.

EXAMPLES

All of the following examples, unless otherwise noted, were run as generally described in detailed description. The materials employed were as follows:

(1) The steel substrates were size (4"×6"×0.032"), which was used as received.

(2) The deposition chamber was Pyrex TM cross of 6" inside diameter.

(3) The cold-trap chamber was Pyrex TM tee of 6" inside diameter.

(4) The sublimation tube was a Pyrex TM tube of 1.5" diameter and 7" long.

(5) The pyrolysis tube was a quartz tube of 1" diameter and 3 feet long.

(6) The pyrolysis furnace, sublimation heater, and temperature controllers were obtained from Hevi-duty Electric Company.

(7) The pressure gauge was a capacitance barometer (available from MKS Instruments as model 220BA).

(8) The vacuum pump was a mechanical rotary pump (available from Sergent-Welch Scientific Company as Model 1375).

(9) The measurement of film thickness was by means of an Elcometer (available from Paul N. Gardner Co., Inc., as model Elcometer 245F).

The examples below involve a corrosion resistance test (scab test), in which test panels are scribed to expose the steel to the testing environments. The scribe line is at the center of the panel and is about 3 inches long. These scribed panels are then subjected to the following test cycle:

Monday through Friday:
15 minute immersion in 5% NaCl solution.
75 minute drying in air at room temperature.
22 hour and 30 minute exposure at 85% relative humidity (R.H.) and 60° C. environment.
Saturday and Sunday:
Samples remain in humidity cabinet (85% R.H., 60° C.).

Samples were examined occasionally. After completion of the scab corrosion test, the test panels were removed from the chamber and rinsed with warm water. The samples were examined visually for failure such as corrosion, lifting, peeling, adhesion loss, or blistering. To evaluate the scribe line corrosion creepback (loss of adhesion between coating and steel), the distance between the scribe line and the unaffected coating was measured: The average of multiple measurements were calculated.

EXAMPLE 1

A sample according to the present invention, a zinc-phosphated chromic acid rinsed galvanized steel substrate having a Parylene TM C (Union Carbide Corp.) coating (0.4 mil), was tested as follows. The zinc-phosphated chromic acid rinsed galvanized steel was obtained from ACT Corporation as product designation GMC 90E Electro Glv70/70; C158 C20 DIW. For deposition of Parylene TM C polymer, the mass of dimer or di(chloro-para-xylylene) was 20 grams, which resulted in a polymer film of 0.4 mil (10 $\mu$m) thick. The film thickness was found to be linearly related to the mass of dimer charged. The deposition time was about 45 minutes (from the onset of power on the sublimation heater to the complete consumption of the dimer charged).

The sample was then subjected to the corrosion test described above for 5 weeks (25 cycles). The dry/wet adhesion was good based on a tape test (ASTM D3359). The average creep distance was 0.7 millimeter, whereas the creep distance for the electrocoated (1.0 mil thick) control sample was 1.0 millimeter. No blistering and little edge corrosion were observed, even if the edge was cut before applying the coating, while in the electrocoated control sample blisterings and minor corrosion occurred at edges.

EXAMPLE 2

The sample tested was a zinc-phosphated chromic acid rinsed galvanized steel substrate with a Parylene TM C coating (0.8 mil). The substrate was a zinc-phosphated chromic acid rinsed galvanized steel obtained from ACT Corporation as product designation GMC 90E Electro Glv70/70; C168 C20 DIW. The deposition of Parylene TM C polymer involved coating the substrate twice to obtain a Parylene TM C film of 0.8 mil (20 $\mu$m) thick. In each deposition, the mass of dimer charged was 20 grams. After the first deposition, the vacuum was needed to be broken to recharge the dimer for the second deposition.

The sample was then subjected to the corrosion test described above for 10 weeks (50 cycles) The dry/wet adhesion was good based on a tape test (ASTM D3359). The average creep distance was 0.7 millimeter, whereas the creep distance for the electrocoated (1.0 mil thick) control sample was 1.6 millimeter. No blistering and little edge corrosion were observed even if the edge was cut before applying the coating, while in the electrocoated control sample blisterings and corrosion occurred at edges.

EXAMPLE 3

The sample tested was a zinc-phosphated chromic acid rinsed steel substrate with a Parylene C coating (0.4 mil). The substrate was a zinc-phosphated chromic acid rinsed steel (available from ACT Corporation as product designation GMC-92C; C168 C68 C20 DIW). The deposition of Parylene C polymer involved applying a mass of dimer or di(chloro-para-xylylene) in the amount of 20 grams, which resulted in a polymer film of 0.4 mil (10 μm) thickness. Deposition time was about 45 minutes (from the onset of power on the sublimation heater to the complete consumption of the dimer charged).

The sample was then subjected to the corrosion test described above for 3 weeks (15 cycles). The dry adhesion was good based on a tape test (ASTM D3359), but the wet adhesion was not as good as the phosphated galvanized steel. The film lost most of its adhesion after cyclic test due to the dissolution of phosphated layer which was confirmed by SEM/EDAX analysis.

Various modifications, alterations, additions, or substitutions to the present invention will be apparent to those skilled in the art without departing from the scope and spirit of this invention and it will be understood that this invention is not unduly limited to the illustrative embodiments set forth herein.

We claim:

1. A method for corrosion protection in automotive production by coating a galvanized metal substrate, which method comprises:
   (a) treating a flat galvanized metal substrate, prior to stamping, with a zinc or iron phosphate containing agent;
   (b) subsequently applying, by means of organic vapor deposition, a film of a polymer onto one side of said galvanized metal substrate;
   (c) subsequently stamping the galvanized metal substrate to shape it for its intended use; and
   (d) subsequently coating the galvanized metal substrate on the second of the two flat sides, opposite to the side having said film, with a primer and/or topcoat.

2. The method of claim 1, wherein the zinc or iron phosphate containing agent is applied in an effective amount to create a microcrystalline surface.

3. The method of claim 1, wherein the metal phosphate containing agent comprises zinc phosphate.

4. The method of claim 1, wherein the treatment in step (a) comprises applying a zinc or iron phosphate containing agent coupled with a passivating rinse.

5. The method of claim 1, wherein the metal substrate is coated with a film of zinc or zinc alloy in an amount of 5–120 grams/m².

6. The method of claim 5, wherein the metal substrate is coated with a film of zinc or zinc alloy in an amount of 10–70 grams/m².

7. The method of claim 1, wherein the polymer is poly-p-xylylene or a derivative thereof.

8. The method of claim 7, wherein the poly-p-xylylene is poly-chloro-para-xylylene.

9. The method of claim 1, wherein organic vapor deposition occurs under vacuum and said polymer is formed from a corresponding reactive monomer species produced through pyrolysis of its corresponding dimer having been sublimed in vacuum.

10. The method of claim 9, wherein the pressure of the vacuum ranges from about 0.001 to 10 torr.

11. The method of claim 1, wherein the thickness of the polymer film ranges from about 1 to 100 μm.

12. The process of claim 9, wherein the deposition time is from 1 minute to 4 hours and the substrate temperature ranges from −196° C. to 80° C.

13. The process of claim 1, wherein the polymer film comprises a plurality of layers deposited in succession on the metal substrate.

14. The method of claim 9, wherein the dimer is a di-para-xylylene or a derivative thereof.

15. The method of claim 5, wherein the metal substrate is an automotive body part.

16. The method of claim 1, wherein the primer is selected from the group consisting of acrylic silane, polyester silane, polyester urethane-silane, melamine/polyester, melamine/polyester urethane, epoxy/anhydride, epoxy/amine, and polyester.

17. A method for coating a galvanized steel substrate, in the form of a flat elongated strip, to protect the galvanized steel substrate from corrosion, which method comprises:
   (a) treating said galvanized steel substrate with a metal phosphate containing agent selected from the group consisting of zinc phosphate and iron phosphate;
   (b) subsequently applying, by means of organic vapor deposition, a film of a polymer onto one side of said galvanized steel substrate so treated, wherein said polymer is selected from the group consisting of poly-p-xylylene, poly(chloro-p-xylylene), and derivatives thereof, wherein said organic vapor deposition is carried out under vacuum and the polymer is formed from a corresponding reactive monomer species produced through pyrolysis of its corresponding dimer;
   (c) subsequently stamping the galvanized steel substrate to shape it for its intended use; and
   (d) subsequently coating the stamped galvanized steel substrate on the second flat side, opposite to the side having said film, with a primer and/or topcoat.

18. The method of claim 17, wherein the primer is coated on the steel substrate by electrocoating.

* * * * *